(12) United States Patent
Schmid

(10) Patent No.: US 6,947,464 B2
(45) Date of Patent: Sep. 20, 2005

(54) SEMICONDUCTOR LASER DEVICE, AND METHOD FOR PRODUCING IT

(75) Inventor: Wolfgang Schmid, Deuerling/Hillohe (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 200 days.

(21) Appl. No.: 10/372,356

(22) Filed: Feb. 24, 2003

(65) Prior Publication Data

US 2004/0028106 A1 Feb. 12, 2004

(30) Foreign Application Priority Data

Feb. 27, 2002 (DE) .......................................... 102 08 463

(51) Int. Cl.[7] .............................................. H01S 5/00
(52) U.S. Cl. ............................ 372/50; 372/43; 372/44; 372/45; 372/46; 372/47; 372/48; 372/49
(58) Field of Search ..................................... 372/43–50

(56) References Cited

U.S. PATENT DOCUMENTS

| | | | | |
|---|---|---|---|---|
| 4,856,017 A | * | 8/1989 | Ungar .......................... | 372/96 |
| 5,012,477 A | * | 4/1991 | Mesquida et al. ............ | 372/50 |
| 5,043,291 A | * | 8/1991 | Devoldere et al. ............ | 438/45 |
| 5,309,470 A | * | 5/1994 | Groussin ...................... | 372/50 |
| 6,009,218 A | * | 12/1999 | Grand et al. ................... | 385/14 |
| 6,757,313 B1 | * | 6/2004 | Connolly et al. ............. | 372/46 |

FOREIGN PATENT DOCUMENTS

| | | | | |
|---|---|---|---|---|
| DE | 19727233 A1 | 7/1999 | ........... | H01L/33/00 |
| EP | 0624284 B1 | 6/1999 | ............. | H01S/3/19 |

OTHER PUBLICATIONS

Schmid, W., "45% Quantum Efficiency Light–Emitting Diodes with Radial Outcoupling Taper", Proceedings of SPIE, vol. 3938, Jan. 26–27, 2000, starting at p. 90.

Schmid W., "Infrared Light–Emitting Diodes with Lateral Outcoupling Taper for High Extraction Efficiency", Proceedings of SPIE, vol. 3621, Jan. 27–28, 1999, starting at p. 198.

* cited by examiner

Primary Examiner—Sun Oh Harvey
Assistant Examiner—Delma R. Flores-Ruiz
(74) Attorney, Agent, or Firm—Cohen, Pontani, Lieberman & Pavane

(57) ABSTRACT

A semiconductor laser device, having an epitaxial semiconductor body (40) with a waveguiding layer (22), which contains an active radiation-generating layer (20), a laser-active emitter region (12), disposed in the epitaxial semiconductor body (40) and having a primary direction (30), which essentially corresponds to the exit direction of the laser radiation from the emitter region, and an amplifier region (14), adjoining the emitter region (12) in the semiconductor body (40) in the primary direction (30), for amplifying the laser radiation. The emitter region (12) and the amplifier region (14) form active regions in the semiconductor material. The waveguiding layer (22) is removed in some regions of the semiconductor body (40) outside the active regions (12, 14), in such a way that flanks (18; 32; 36) of the semiconductor body (40) that are produced by the removal form a shallow angle τ with the plane in which lies the waveguiding layer.

12 Claims, 3 Drawing Sheets

SEMICONDUCTOR LASER DEVICE, AND METHOD FOR PRODUCING IT

FIELD OF THE INVENTION

The invention relates to a semiconductor laser device, with an emitter region and an amplifier region, designed to be a light source of high billiance and, in particular, to a technique for reducing the adverse effects of backscatter on the beam quality.

BACKGROUND OF THE INVENTION

Semiconductor laser devices are known that have an epitaxial semiconductor body with a waveguiding layer, which contains an active radiation-generating layer, a laser-active emitter region, disposed in the epitaxial semiconductor body and having a primary light projection direction (referred to herein as the "primary direction"), which essentially corresponds to the exit direction of the laser radiation from the emitter region, and an amplifier region, adjoining the emitter region in the semiconductor body in the primary direction, for amplifying the laser radiation. The emitter region and the amplifier region form active regions in the semiconductor material.

Semiconductor lasers of this kind are used as light sources of high brilliance. Because of the high intensities, however, there is the problem that scattered light, or light backscattered (used interchangeably herein with backreflected) into the active region, interferes with the desired laser emission and/or makes the beam quality worse.

Various principles are known for counteracting this problem. For instance, the facets of the active regions are made nonreflective, to suppress unwanted backreflections into the active region. Another known principle is to etch V-shaped notches into the epitaxial layers outside the active components, and to fill these notches with absorbent material.

European Patent EP-B 0 624 284 shows and describes a semiconductor laser amplifier arrangement, in which oblique notches with 45° flanks are etched into the epitaxial layers on both sides of the arrangement. Light back-reflected from the end face is meant to be reflected laterally and vertically away from the component by these notches.

SUMMARY OF THE INVENTION

An object of the invention is to improve a semiconductor laser device of the type described above in such a way that the proportion of radiation scattered or back-scattered into the active regions is reduced, thus further improving the beam quality.

This and other objects are attained in accordance with one aspect of the invention directed to a semiconductor laser device, having an epitaxial semiconductor body with a waveguiding layer, which contains an active radiation-generating layer. A laser-active emitter region is disposed in the epitaxial semiconductor body having a primary direction, which essentially corresponds to the exit direction of the laser radiation from the emitter region. An amplifier region, adjoining the emitter region in the semiconductor body in the primary direction, is provided for amplifying the laser radiation, wherein the emitter region and the amplifier region form active regions in the semiconductor material. The waveguiding layer is at least partly removed in some regions of the semiconductor body outside the active regions, in such a way that flanks of the semiconductor body that are produced by the removal form a shallow angle $\tau$ with a plane in which lies the waveguiding layer.

Another aspect of the invention is directed to a method for producing a semiconductor laser device as described just above, in which the waveguiding layer is removed by dry etching of a reshaped photoresist.

According to the invention, in a semiconductor laser device of the type described above, the waveguiding layer is removed to form grooves in some regions of the semiconductor body outside the active regions. The term "grooves" as used herein in connection with the invention refers to removal of material in such a way that a tapered ridge is formed in the semiconductor body which is defined on its sides by flanks, and its upper surface is the surface of the semiconductor body. The flanks of the ridge form a shallow angle $\tau$ with its upper surface. A shallow angle within the scope of the present invention means an angle of less than 45°.

By means of the shallow flanks provided in accordance with the invention, the laser radiation is diffracted into an underlying substrate gradually and without interfering back-reflection. Conversely, with 45° flanks of conventional notches, radiation can be reflected back into the active layer, since such flanks deflect the radiation into a virtually perpendicular direction to the epitaxial layer where, because of the different indexes of refraction of the epitaxial layers, the radiation can be reflected and then at the flank reflected back again into the active layer.

In a preferred embodiment of the invention, it is provided that grooves are disposed in the waveguiding layer on both sides of the emitter region and extending along the primary direction of the emitter region. The grooves form the above-described tapered ridge at the emitter region. The flanks form a shallow angle $\tau$ with the upper surface of the semiconductor body.

In another preferred embodiment of the invention, it is provided that the waveguiding layer is removed on both sides of and along the primary direction of the emitter region, and the flanks of the semiconductor body form a shallow angle $\tau$ with its surface.

Also in the semiconductor laser device of the invention, the waveguiding layer can advantageously be removed on both sides of and along the amplifier region, and the flanks thus formed of the semiconductor body form a shallow angle $\tau$ with its surface.

In this connection, it is especially preferred if the amplifier region widens conically in the direction away from the emitter region. As a result, the laser radiation can widen diffraction-limited, with a Gaussian radiation profile, and greater amplification before the onset of saturation is achieved.

In particular, it can be provided that the waveguiding layer is removed on both sides of both the emitter region and the amplifier region.

Also, alternatively or in addition to the provisions recited above, grooves can be made in the waveguiding layer on both sides of the active regions, the grooves being at an angle $\phi$ to the primary direction, and their flanks forming a shallow angle $\tau$ with the surface of the semiconductor body.

In this respect, it is preferably provided that two grooves, made on both sides of the active regions and at an angle $\phi$ to the primary direction, define between them a narrow interstice for the propagation of the laser radiation in the semiconductor body.

In such an embodiment, it is especially preferred if the angle $\phi$ between the grooves and the primary direction is between 90° and 135°. Grooves of the type recited form an extremely effective optical loss mechanism for a proportion of the laser radiation reflected back from an exit face of the amplifier region.

In especially preferred embodiments, the flank angle τ is between 1° and 35°, preferably between 10° and 30°.

In an advantageous refinement of the semiconductor laser device of the invention, it is provided that the flanks of the semiconductor body are covered with an absorbent material.

In a method of the invention for producing a semiconductor laser device of the above type, the waveguiding layer is removed by dry etching of a reshaped photoresist.

In order to expediently remove the waveguiding layer, a photoresist layer is applied to the semiconductor body. The photoresist is reshaped in a solvent atmosphere and/or by heating of the resist, that is, put into a form which is meant to be transferred at least partly into the semiconductor body (sharp edges of a structured photoresist are rounded—the photoresist layer is converted into an elongated, barrel-vaulted shape). The structure of the shallow flanks of the photoresist is transferred to the semiconductor body by dry etching.

The invention is applicable to semiconductor laser devices of all material systems, such as semiconductor laser devices based on GaP, GaAsP, GaAs, GaAlAs, InGaAsP, GaN, or InGan semiconductor material.

DETAILED DESCRIPTION OF THE DRAWINGS

Figure 1A:
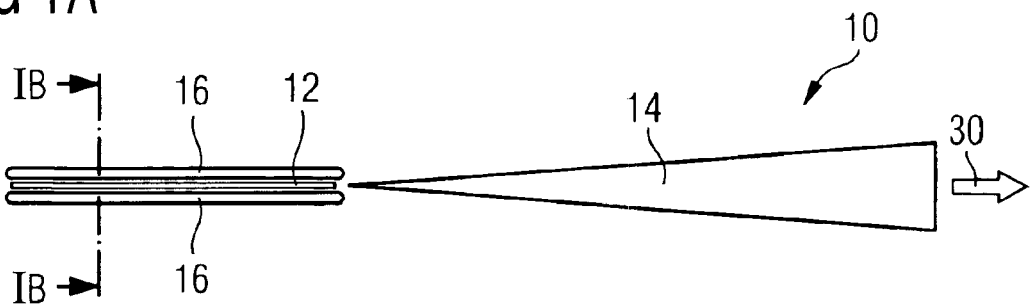
FIG. 1a shows a schematic elevation view of a semiconductor laser, according to one exemplary embodiment of the invention.
Figure 1B:
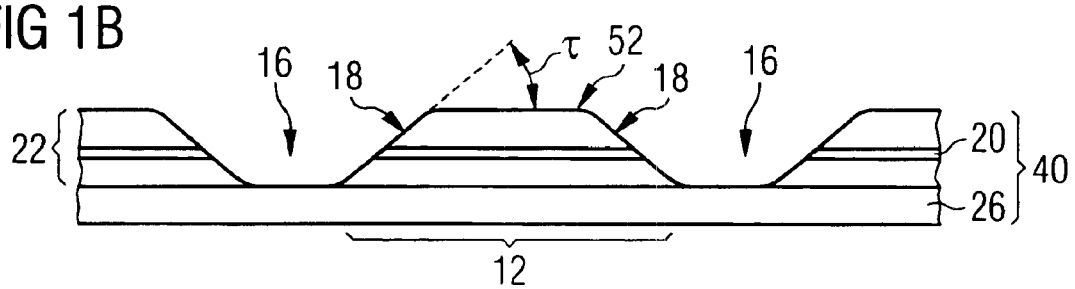
FIG. 1b shows a sectional view of the semiconductor laser of FIG. 1a taken along the line IB—IB.

Elements corresponding to one another are identified in all the drawings by the same reference numerals. FIGS. 1a and 1b will be discussed first. A semiconductor laser of high brilliance, generally identified by reference numeral 10, is shown in a first exemplary embodiment of the invention. The semiconductor laser 10 has a laser-active elongated emitter region 12 and a conically widened amplifier region 14 adjoining it in the primary direction 3o. As is well known, the shape of the amplifier region is defined by the shape of the electrical terminals, which themselves are not shown.

The semiconductor body 40 of the semiconductor laser 10 has a sequence of epitaxial layers that have been grown on a substrate 26. The epitaxial layers include an active radiation-emitting layer 20, which is disposed in a sheet-like waveguiding layer 22. In the exemplary embodiment, the waveguiding layer comprises two layers of a material that, compared to the active layer 20, has a higher band gap and a lower index of refraction. The precise embodiment of the layer sequence is not essential to the present invention and will therefore not be described in further detail. The invention can be employed with conventional layer sequences, known to one with ordinary skill in the art, for semiconductor laser devices of the generic type in question. In addition to layers 20 and 22, the semiconductor body 40 also has other semiconductor layers as well as contact layers for impressing current into the active layer 20. These are also well known to one with ordinary skill in the art and are, therefore, not shown in the drawings or described in further detail herein.

In operation, laser radiation is generated in the emitter region 12. It is amplified in the amplifier region 14 and projected in the primary direction represented by the arrow 30. Because of the conical shape of the amplifier region, the laser radiation can widen with a Gaussian radiation profile and with limited diffraction, and greater amplification before the onset of saturation is achieved.

On both sides of the emitter region 12, parallel to the primary direction 30, two grooves 16 are etched. Their formation will be described in further detail below in conjunction with FIGS. 4a to 4e. The grooves 16 are designed such that the flanks 18 of ridge formed in the semiconductor body by the grooves are at a shallow angle τ relative to a plane in which lies the sheet-like waveguiding layer 22. The angle τ in the present exemplary embodiment is approximately 20°. Surface 52 of the semiconductor body is substantially parallel to the plane of the waveguiding layer 22. For the sake of greater clarity of illustration, the layer structure in FIG. 1(b) is shown exaggerated and not to scale, so that the angle τ appears steeper. As a result of the shallow flank angle, the radiation extending laterally outward from the active layer can be deflected gradually, under some circumstances by means of multiple reflections from the epitaxial layers and the flank, and diffracted into the substrate 26. Disruption of the active region from backreflected radiation is maximally avoided.

Figure 2A:
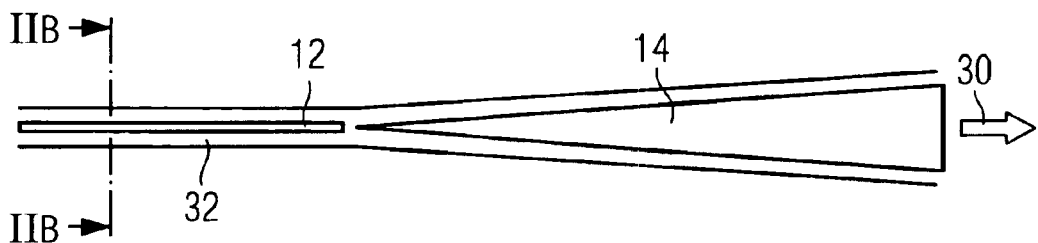
FIG. 2a shows a schematic elevation view of a semiconductor laser in another exemplary embodiment of the invention.
Figure 2B:
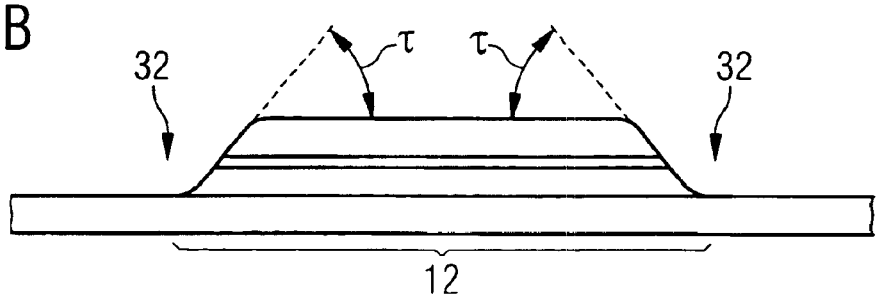
FIG. 2b shows a sectional view of the semiconductor laser of FIG. 2a taken along the line IIB—IIB.

Another design is shown in the exemplary embodiment of FIGS. 2a and 2b. Elements that correspond to the elements of the exemplary embodiment of FIGS. 1a and 1b are identified by the same reference numerals and will not be described again. In the exemplary embodiment of FIG. 2, the epitaxial semiconductor body is etched both outside the emitter region 12 and outside the amplifier region 14, in order to form flanks 32 along both of these active regions. Flanks 32 form a shallow angle τ, in the present case of approximately 15°, with the surface 52 of the semiconductor body 40.

Figure 3A:
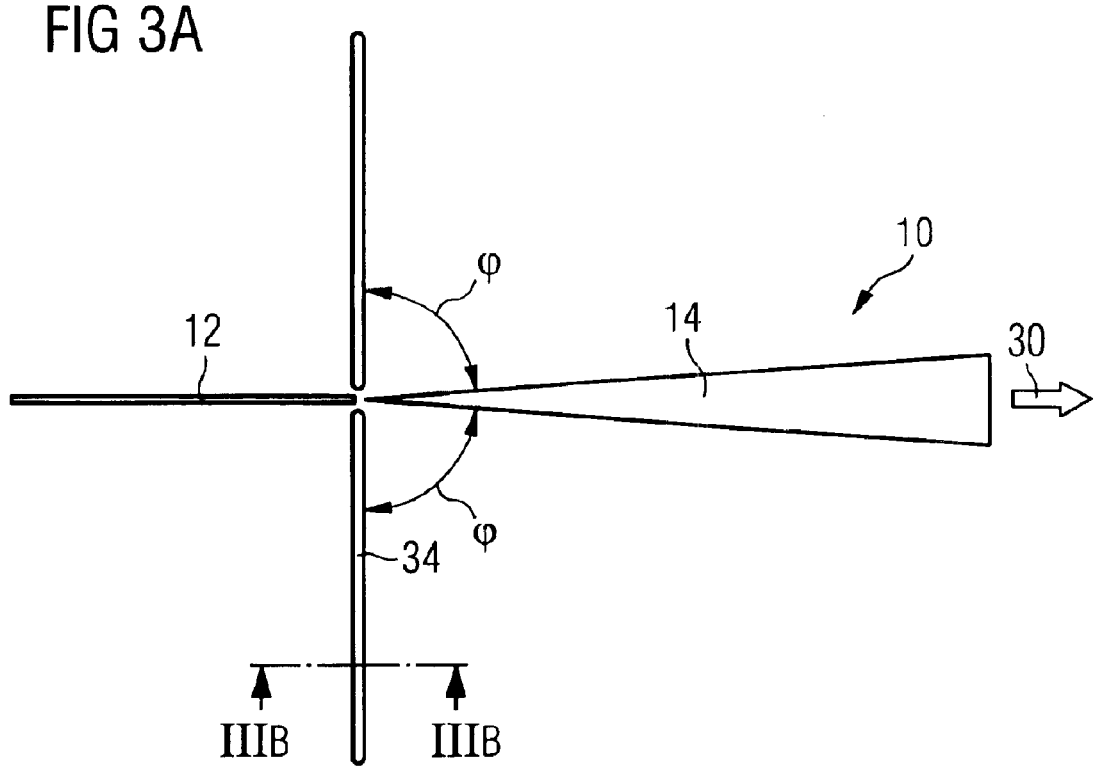
FIG. 3a shows a schematic elevation view of a semiconductor laser, in a further exemplary embodiment of the invention.
Figure 3B:
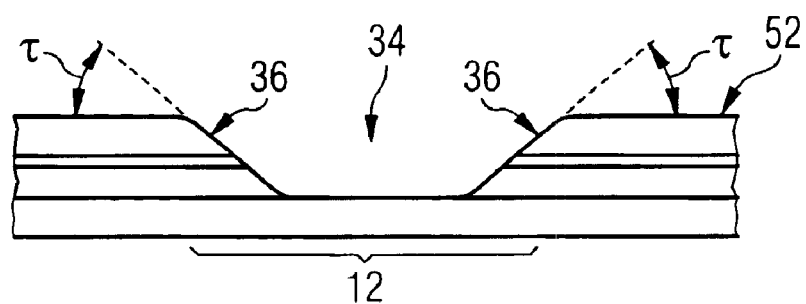
FIG. 3b shows a sectional view of the semiconductor laser of FIG. 3a, taken along the line IIIB—IIIB.

A further exemplary embodiment is shown in FIGS. 3(a) and 3(b). In it, two grooves 34 are made in the semiconductor body 40, which each form an angle φ, of approximately 90° in the exemplary embodiment, with the primary direction 30. Once again, the flanks 36 of the grooves 34 form a shallow angle τ, of approximately 30° in the exemplary embodiment, with the surface 52 of the semiconductor body 40. The grooves 34 represent a highly effective optical loss mechanism for the proportion of the laser radiation that is backreflected from an exit face of the amplifier region 14.

The grooves 34 leave a narrow interstice 38 open between them, through which the laser radiation can be propagated from the emitter region 12 to the amplifier region 14. The radiation backreflected from the exit face, particularly in higher three-dimensional modes, is, however, very predominantly reflected laterally or vertically away from the active regions 12, 14 by the flanks of the grooves 34.

It is understood that the features shown herein can also be combined. For instance, the grooves 34 of FIGS. 3a and 3b can be used in the embodiment of FIGS. 1a and 1b.

Figure 4A:
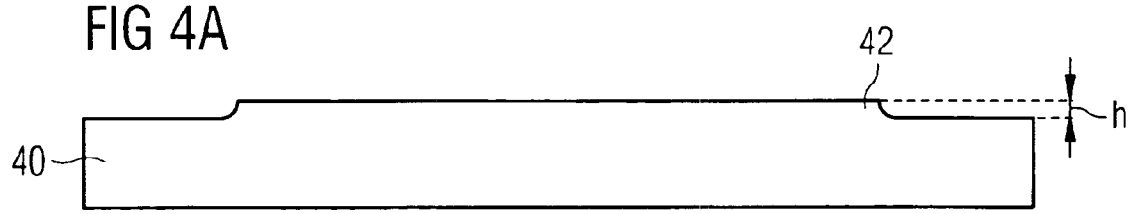
FIGS. 4a to 4e show, schematically, a method sequence for creating a shallow flank angle in the production of a semiconductor laser of the invention.

A preferred way of creating the shallow angle of the flanks is shown schematically in FIGS. 4a through 4e. FIG. 4a shows the semiconductor body 40, which, although not expressly shown in the drawing, already has the desired semiconductor layer sequence of the semiconductor laser device.

Now, in a first step using standard lithography methods, a base 42 of height h, of about 300 nm in the exemplary embodiment, is created. The edges of the base 42 define the points where the shallow flanks will later be created. Although for the sake of explanation only one base 42 is shown in FIG. 4, it is understood that a plurality of such bases 42 may optionally also be made on the semiconductor body 40, for instance to produce the structure shown in FIG. 1b.

Figure 4B:
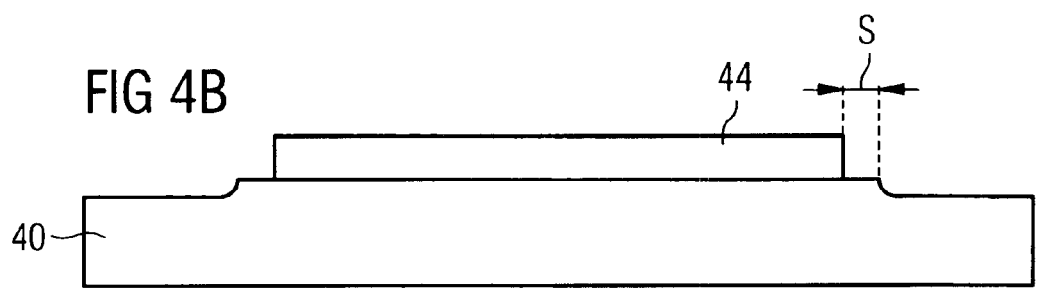

Now, as shown in FIG. 4b, a photoresist 44 is applied to the base 42 and structured, so that from the edge of the base to the edge of the photoresist, a flow path "s" of approximately 5 µm in length, in this exemplary embodiment, remains open.

Figure 4C:
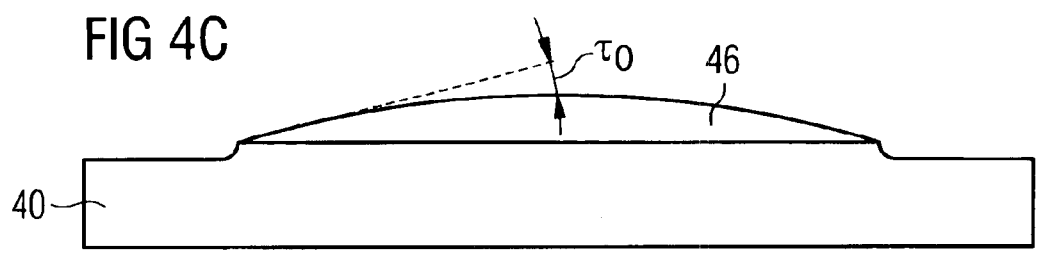
Figure 4D:
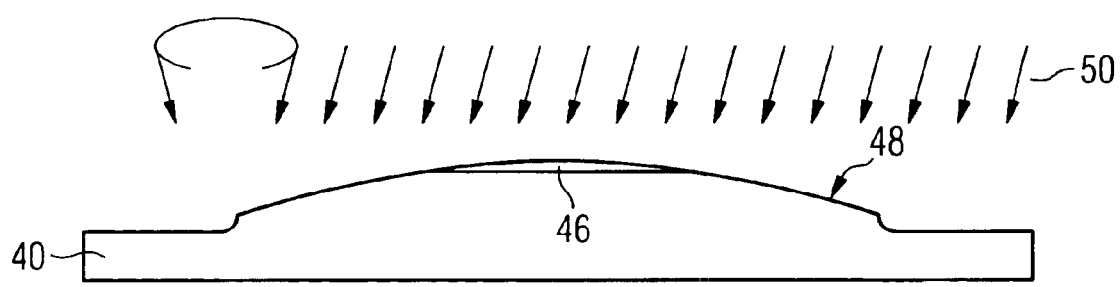

Next, the photoresist 44 is reshaped in a solvent atmosphere and/or by heating the resist. This causes the photoresist 44 in the edge regions of the base 42 to flow along the flow path "s" as far as the edge of the semiconductor base 42. This creates a reshaped resist structure 46, which at its edges has a shallow angle $\tau_0$ to the surface of the semiconductor body 40, as shown in FIG. 4c.

These shallow angles are now transferred (FIG. 4d) to the semiconductor body in a dry etching process, for instance by ion beams 50 in chemical assisted ion-beam etching (CAIBE). This technique is described in the article "45% Quantum Efficiency Light-Emitting Diodes with Radial Outcoupling Taper" by W. Schmid et al., published in Jan. 26, 2000, the content of which is hereby incorporated by reference. If the etching process has a selectivity of 1, the angle is transferred unchanged to the semiconductor, so that in the semiconductor, a flank angle $\tau$–$\tau_0$ is created. By a suitable choice of the photoresist 44 and of the etching conditions, however, some other selectivity can also be attained, so that the angle $\tau$ can be increased or decreased as desired relative to the angle $\tau_0$.

The above-mentioned article by Schmid et al. provides more details about the process for transferring the shape of the photoresist to the semiconductor body.

Figure 4E:
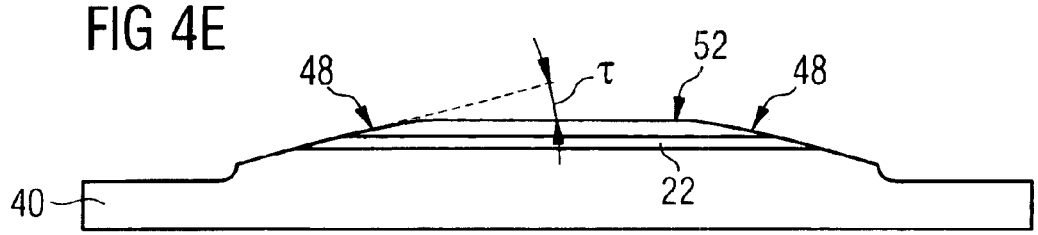
Figure 1A:
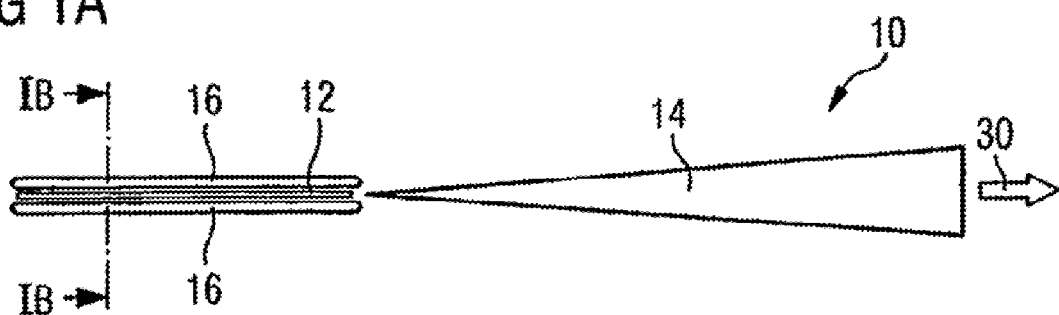
Figure 1B:
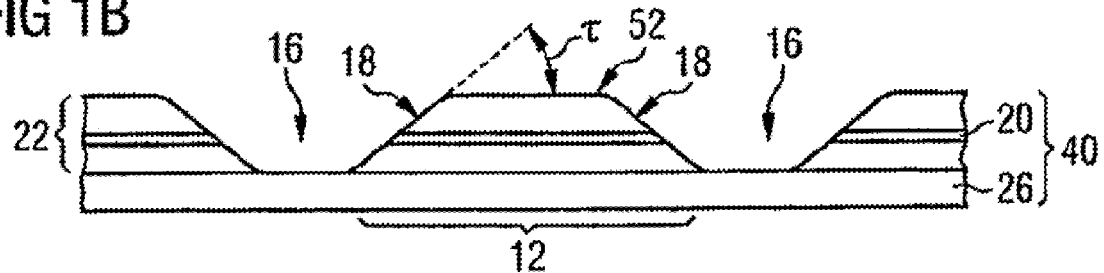
Figure 2A:
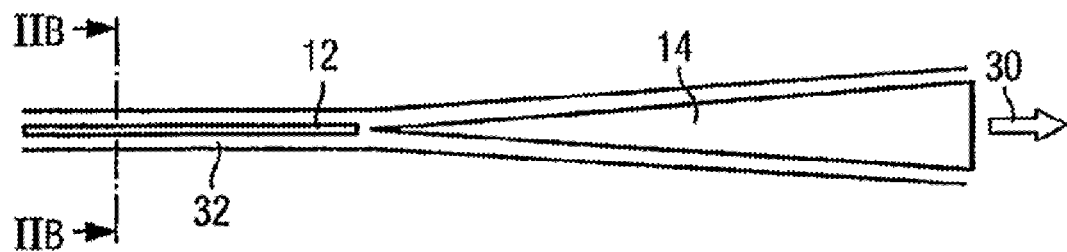
Figure 2B:
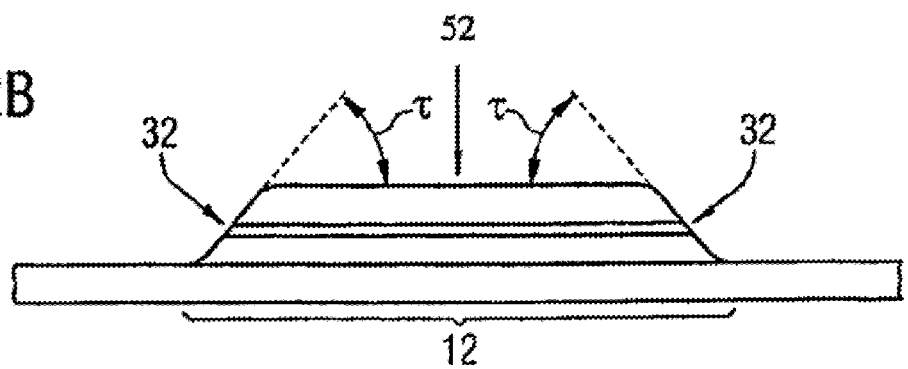
Figure 3A:
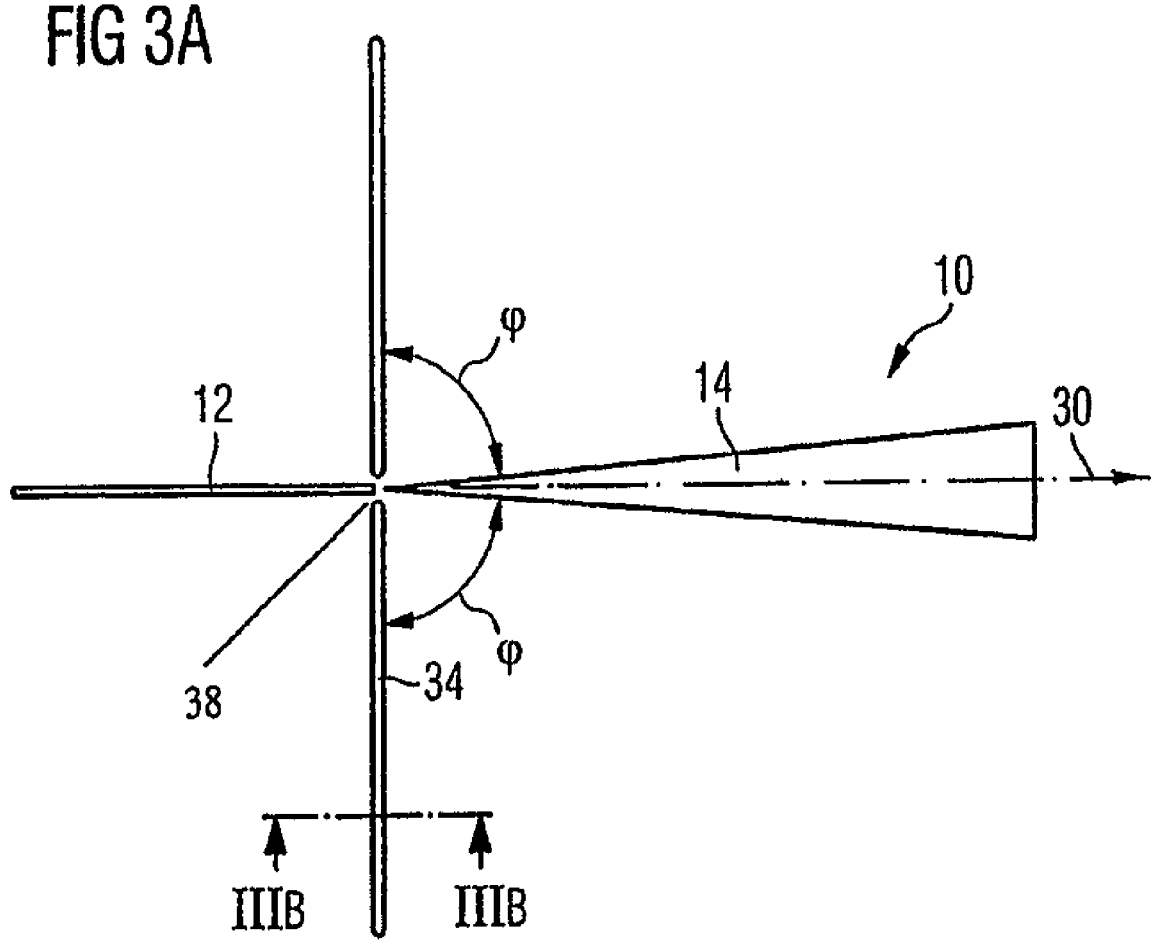
Figure 3B:
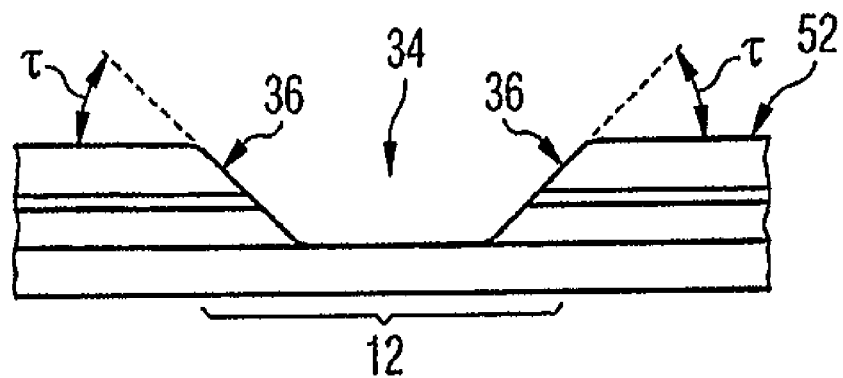
Figure 1A:
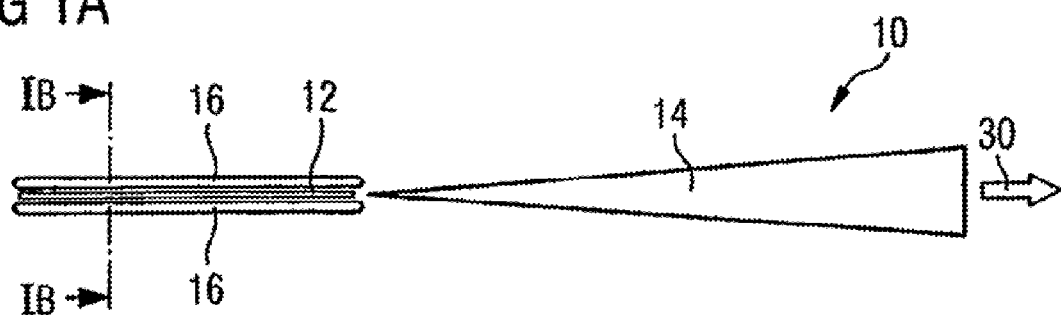
Figure 1B:
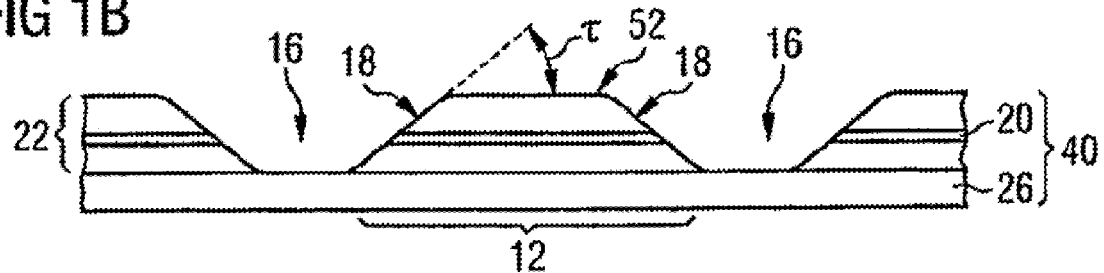
Figure 2A:
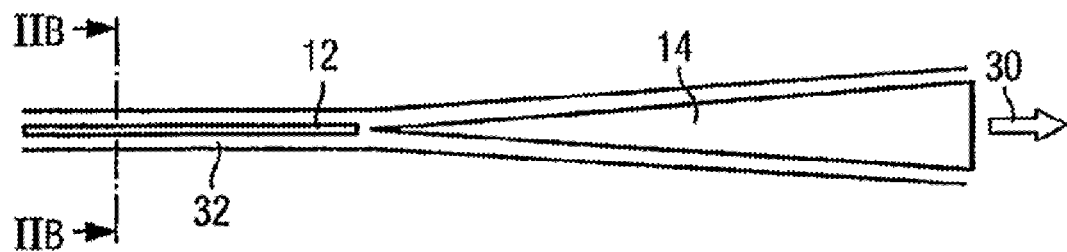
Figure 2B:
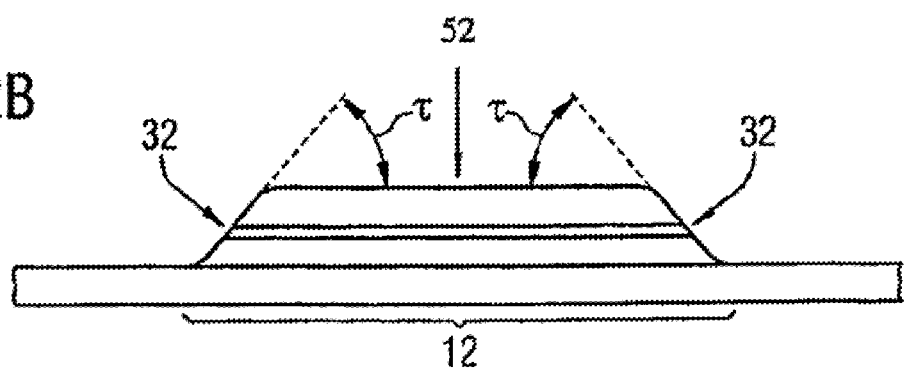
Figure 3A:
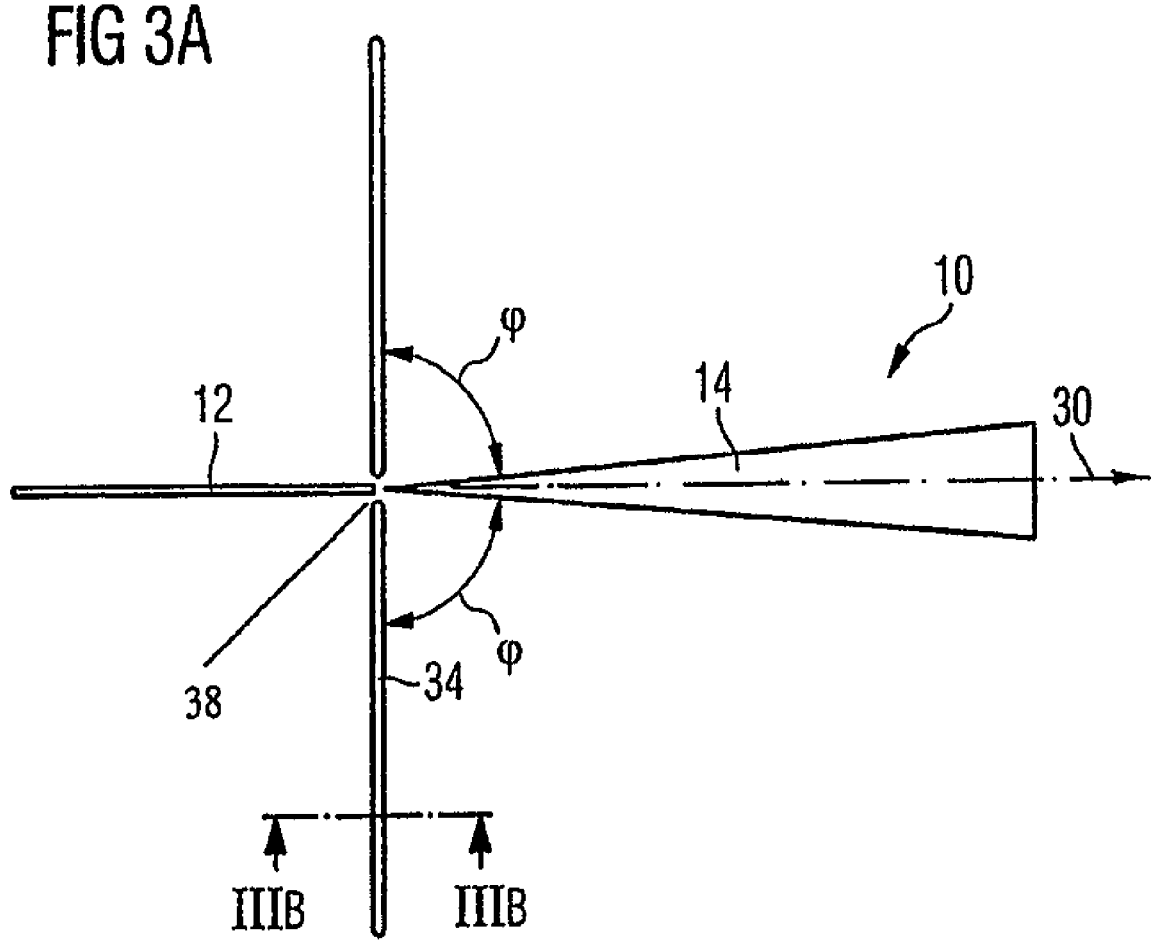
Figure 3B:
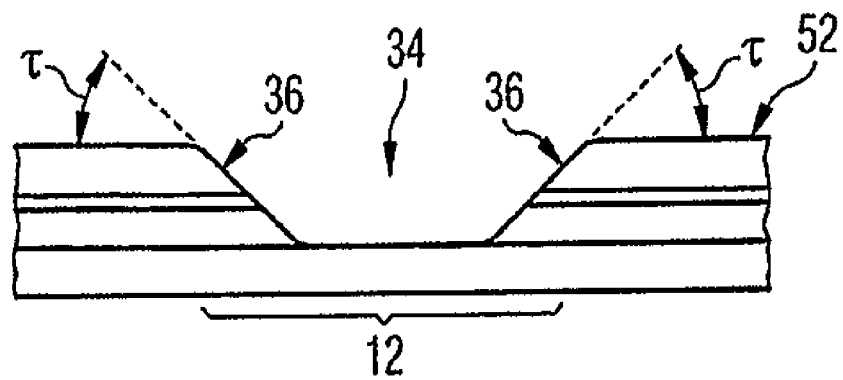

The situation after the etching of the shallow angles is shown in FIG. 4e. The active regions of the semiconductor body 40 have shallow flanks 48, which change over into the planar surface 52, on which, in a further step, electrical contacts are applied, for instance.

It should be understood that the invention is not limited to the exemplary embodiments disclosed in detail hereinabove. The principles of the invention can, for instance, be applied to wide-strip lasers, ridge lasers, electrically and/or optically pumped systems, optical amplifiers, surface-emitting lasers with a vertical resonator (so-called VCSELs), discrete or monolithically integrated externally pumped surface-emitting lasers with a vertical resonator (so-called VECSELs), laser and amplifier arrays (in this case for reducing crosstalk), pulsed lasers with an extreme peak output, and laser systems with external resonators. Also, various modifications will readily occur to anyone with ordinary skill in the art. All variations and modifications such as those mentioned above are intended to fall within the scope of the present invention as defined by the following claims.

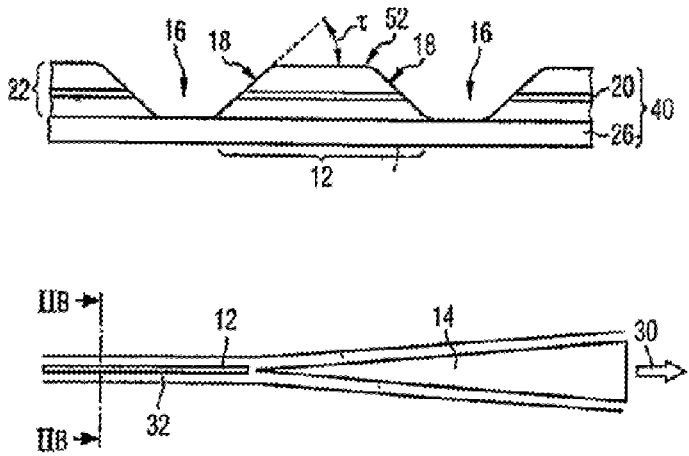

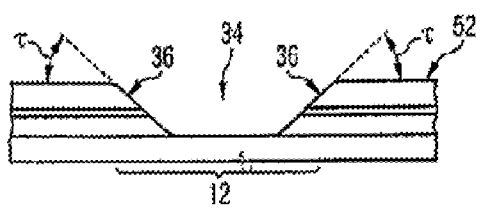

What is claimed is:

1. A semiconductor laser device, having
an epitaxial semiconductor body (40) with a waveguiding layer (22), which contains an active radiation-generating layer (20),
a laser-active emitter region (12), disposed in the epitaxial semiconductor body (40) and having a primary direction (30), which essentially corresponds to the exit direction of the laser radiation from the emitter region, and
an amplifier region (14), adjoining the emitter region (12) in the semiconductor body (40) in the primary direction (30), for amplifying the laser radiation,
wherein the emitter region (12) and the amplifier region (14) form active regions in the semiconductor material,
characterized in that
the waveguiding layer (22) is at least partly removed in some regions of the semiconductor body (40) outside the active regions (12, 14), in such a way that flanks (18; 32; 36) of the semiconductor body (40) that are produced by the removal form a shallow angle $\tau$ with a plane in which lies said waveguiding layer.

2. The semiconductor laser device of claim 1,
characterized in that
grooves (16) are disposed in the waveguiding layer (22) on both sides of the emitter region (12) and extending along the primary direction (30) of the emitter region, with which grooves flanks (18) at the emitter region are formed, which form a shallow angle $\tau$ with said plane of the waveguiding layer.

3. The semiconductor laser device of claim 1,
characterized in that
the waveguiding layer (22) is removed on both sides of and along the primary direction (30) of the emitter region (12), and the flanks (32) thus formed of the semiconductor body (40) form a shallow angle $\tau$ with said plane of the waveguiding layer.

4. The semiconductor laser device of claim 1,
characterized in that
the waveguiding layer (22) is removed on both sides of and along the amplifier region (14), and the flanks (32) thus formed of the semiconductor body (40) form a shallow angle $\tau$ with said plane of the waveguiding layer.

5. The semiconductor laser device of claim 4,
characterized in that
the amplifier region (14) widens, in particular conically, in the direction away from the emitter region (12).

6. The semiconductor laser device of claim 1,
characterized in that
grooves (16, 32, 34) are made in the waveguiding layer (22) on both sides of one or more active regions (12, 14), which grooves are at an angle $\phi$ to the primary propagation direction (30) of the laser radiation and form flanks (36) of the semiconductor body (40), which form a shallow angle $\tau$ with said plane of the waveguiding layer.

7. The semiconductor laser device of claim 1,
characterized in that
two grooves (16, 32, 34), extending side by side and in particular parallel, that are made in the epitaxial semiconductor body and form a shallow angle $\tau$ with the primary extension direction of the waveguiding layer define between them a narrow interstice (38) for the propagation of the laser radiation in the semiconductor body (40).

8. The semiconductor laser device of claim 6, characterized in that
the angle φ between the grooves (34) and the primary propagation direction (30) is between 90° and 135°.

9. The semiconductor laser device of claim 1, characterized in that
the flank angle τ is between 1° and 35°, preferably between 10° and 30°.

10. The semiconductor laser device of claim 1, characterized in that
the flanks (18; 32; 36) of the semiconductor body (40) are covered with an absorbent material.

11. A method for producing a semiconductor laser device of claim 1, in which the waveguiding layer is removed by dry etching of a reshaped photoresist.

12. The method of claim 11, in which to remove the waveguiding layer, photoresist layer is applied to the semiconductor body;

the photoresist is reshaped in a solvent atmosphere and/or by heating of the resist; and the structure of the shallow flanks of the photoresist is transferred to the semiconductor body by dry etching.

* * * * *

UNITED STATES PATENT AND TRADEMARK OFFICE
CERTIFICATE OF CORRECTION

PATENT NO.       : 6,947,464 B2
APPLICATION NO.  : 10/372356
DATED            : September 20, 2005
INVENTOR(S)      : Wolfgang Schmid It is certified that error appears in the above-identified patent and that said Letters Patent is hereby corrected as shown below:

Col. 2, line 58, replace the symbol "Φ" with -- φ --

Col. 2, line 61, replace the symbol "Φ" with -- φ --

Col. 2, line 66, replace the symbol "Φ" with -- φ --

Col. 4, line 53, replace the symbol "Φ" with -- φ --

Col. 6, line 53, replace the symbol "Φ" with -- φ --

Col. 7, line 3, replace the symbol "Φ" with -- φ --

Col. 8, line 6, replace the expression "photoresist layer" with -- a photoresist layer --

Delete sheet 1 of 3 and replace with attached sheet.

In Fig. 2B of the attached replacement sheet 1/3, reference numeral "52" has been added and the lead lines for reference numeral "32" have been modified.

Delete sheet 2 of 3 and replace with attached sheet.

In Fig. 3A of the attached replacement sheet 2/3, reference numeral "38" has been added and the dashed line "30" has been modified.

Signed and Sealed this

Eighteenth Day of September, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,947,464 B2 | Page 1 of 5 |
| APPLICATION NO. | : 10/372356 | |
| DATED | : September 20, 2005 | |
| INVENTOR(S) | : Wolfgang Schmid | |

It is certified that error appears in the above-identified patent and that said Letters Patent is hereby corrected as shown below:

Delete the title page and substitute therefor the attached title page.

Col. 2, line 58, replace the symbol "Φ" with -- φ --

Col. 2, line 61, replace the symbol "Φ" with -- φ --

Col. 2, line 66, replace the symbol "Φ" with -- φ --

Col. 4, line 53, replace the symbol "Φ" with -- φ --

Col. 6, line 53, replace the symbol "Φ" with -- φ --

Col. 7, line 3, replace the symbol "Φ" with -- φ --

Col. 8, line 6, replace the expression "photoresist layer" with -- a photoresist layer --

Delete sheet 1 of 3 and replace with attached sheet.

In Fig. 2B of the attached replacement sheet 1/3, reference numeral "52" has been added and the lead lines for reference numeral "32" have been modified.

Delete sheet 2 of 3 and replace with attached sheet.

UNITED STATES PATENT AND TRADEMARK OFFICE
CERTIFICATE OF CORRECTION

PATENT NO. : 6,947,464 B2
APPLICATION NO. : 10/372356
DATED : September 20, 2005
INVENTOR(S) : Wolfgang Schmid It is certified that error appears in the above-identified patent and that said Letters Patent is hereby corrected as shown below:

In Fig. 3A of the attached replacement sheet 2/3, reference numeral "38" has been added and the dashed line "30" has been modified.

This certificate supersedes Certificate of Correction issued September 18, 2007.

Signed and Sealed this

Twenty-third Day of October, 2007

JON W. DUDAS
*Director of the United States Patent and Trademark Office*

(12) United States Patent
Schmid

(10) Patent No.: US 6,947,464 B2
(45) Date of Patent: Sep. 20, 2005

(54) SEMICONDUCTOR LASER DEVICE, AND METHOD FOR PRODUCING IT

(75) Inventor: Wolfgang Schmid, Deuerling/Hillohe (DE)

(73) Assignee: Osram Opto Semiconductors GmbH, Regensburg (DE)

(*) Notice: Subject to any disclaimer, the term of this patent is extended or adjusted under 35 U.S.C. 154(b) by 200 days.

(21) Appl. No.: 10/372,356

(22) Filed: Feb. 24, 2003

(65) Prior Publication Data
US 2004/0028106 A1 Feb. 12, 2004

(30) Foreign Application Priority Data
Feb. 27, 2002 (DE) .................................. 102 08 463

(51) Int. Cl.$^7$ .................................................. H01S 5/00
(52) U.S. Cl. .......................... 372/50; 372/43; 372/44; 372/45; 372/46; 372/47; 372/48; 372/49
(58) Field of Search ........................................ 372/43–50

(56) References Cited
U.S. PATENT DOCUMENTS

| | | | |
|---|---|---|---|
| 4,856,017 A | * | 8/1989 | Ungar ............................. 372/96 |
| 5,012,477 A | * | 4/1991 | Mesquida et al. ............. 372/50 |
| 5,043,291 A | * | 8/1991 | Develdere et al. ............ 438/45 |
| 5,309,470 A | * | 5/1994 | Groussin ........................ 372/50 |
| 6,009,218 A | * | 12/1999 | Oraed et al. ................... 385/14 |
| 6,757,313 B1 | * | 6/2004 | Connolly et al. .............. 372/46 |

FOREIGN PATENT DOCUMENTS

| | | | |
|---|---|---|---|
| DE | 19727233 A1 | 7/1999 | H01L/33/00 |
| EP | 0624284 B1 | 6/1999 | H01S/3/19 |

OTHER PUBLICATIONS

Schmid, W., "45% Quantum Efficiency Light-Emitting Diodes with Radial Outcoupling Taper", Proceedings of SPIE, vol. 3938, Jan. 26–27, 2000, starting at p. 90.

Schmid W., "Infrared Light-Emitting Diodes with Lateral Outcoupling Taper for High Extraction Efficiency", Proceedings of SPIE, vol. 3621, Jan. 27–28, 1999, starting at p. 198.

* cited by examiner

*Primary Examiner*—Sun Oh Harvey
*Assistant Examiner*—Delma R. Flores-Ruiz
(74) *Attorney, Agent, or Firm*—Cohen, Pontani, Lieberman & Pavane

(57) ABSTRACT

A semiconductor laser device, having an epitaxial semiconductor body (40) with a waveguiding layer (22), which contains an active radiation-generating layer (20), a laser-active emitter region (12), disposed in the epitaxial semiconductor body (40) and having a primary direction (30), which essentially corresponds to the exit direction of the laser radiation from the emitter region, and an amplifier region (14), adjoining the emitter region (12) in the semiconductor body (40) in the primary direction (30), for amplifying the laser radiation. The emitter region (12) and the amplifier region (14) form active regions in the semiconductor material. The waveguiding layer (22) is removed in some regions of the semiconductor body (40) outside the active regions (12, 14), in such a way that flanks (18; 32; 36) of the semiconductor body (40) that are produced by the removal form a shallow angle τ with the plane in which lies the waveguiding layer.

12 Claims, 3 Drawing Sheets